US006374942B1

(12) United States Patent
Huggins

(10) Patent No.: US 6,374,942 B1
(45) Date of Patent: Apr. 23, 2002

(54) SYSTEM AND METHOD FOR A COMBINED ROTATABLE MECHANICAL AND ELECTRICAL SPEAKER MOUNTING SYSTEM

(76) Inventor: John M. Huggins, 15595 Lewis Rd., Nevada City, CA (US) 95959

( * ) Notice: Subject to any disclaimer, the term of this patent is extended or adjusted under 35 U.S.C. 154(b) by 0 days.

(21) Appl. No.: 09/677,163

(22) Filed: Oct. 2, 2000

Related U.S. Application Data

(60) Provisional application No. 60/177,551, filed on Jan. 21, 2000.

(51) Int. Cl.[7] .................................................. H05K 5/00

(52) U.S. Cl. ........................ 181/150; 181/153; 181/199

(58) Field of Search ................................ 181/150, 141, 181/144, 145, 153, 199

(56) References Cited

U.S. PATENT DOCUMENTS 5,206,464 A * 4/1993 Lamm et al. ............... 181/150
5,739,480 A * 4/1998 Lin ............................ 181/144
5,828,765 A * 10/1998 Gable ......................... 181/150
6,002,780 A * 12/1999 Espiritu ...................... 181/144
6,070,694 A * 6/2000 Burdett et al. .............. 181/150

* cited by examiner

*Primary Examiner*—Khanh Dang
(74) *Attorney, Agent, or Firm*—Thomas, Kayden, Horstemeyer & Risley

(57) ABSTRACT

A system and method for providing concurrent mechanical and electrical connections to a speaker system allows full rotational motion of a speaker with respect to an enclosure. The system comprises a mechanical mounting mechanism having an integrated electrical coupling mechanism configured to establish a concurrent mechanical and electrical connection between the speaker and the enclosure. The mounting system comprises cylindrical intermating members that are configured to axially and concentrically couple with one another, which allows the speaker to have a full range of rotational motion with respect to the enclosure. Thus, the system is designed so that the cylindrical intermating members of the speaker portion of the system concentrically and axially couple with the cylindrical intermating members of the enclosure portion of the system, thereby allowing concurrent electrical and mechanical coupling between the speaker and the enclosure. The speaker is allowed a full range of rotational motion with respect to the enclosure because the coupling of the speaker to the enclosure is done via axially concentric cylindrical intermating members.

17 Claims, 12 Drawing Sheets

SYSTEM AND METHOD FOR A COMBINED ROTATABLE MECHANICAL AND ELECTRICAL SPEAKER MOUNTING SYSTEM

CROSS-REFERENCE TO RELATE APPLICATION

This application claims the benefit of U.S. provisional application Ser. No. 60/177,551, filed Jan. 21, 2000, and entitled "Combination Speaker Mounting/Electrical Connection System," the contents of which are hereby incorporated by reference in their entirety.

TECHNICAL FIELD

The present invention is generally related to a speaker mounting system and, more particularly, is related to a system and method for providing concurrent mechanical and electrical connections between a speaker and an enclosure while allowing a full range of rotational motion between the speaker and the enclosure.

BACKGROUND OF THE INVENTION

Audio electro-acoustic speakers, especially small speakers or high frequency speakers, suffer from directionality and sound-distance attenuation limitations. That is, audio speakers create sound waves that propagate from the speaker outward, with an attenuation, which, at a sufficient distance, approximates an exponential drop off. For example, listeners positioned directly in front of the speaker benefit from a reduced attenuation relative to listeners positioned to the sides or above or below the speaker axis. Speakers can also be aimed away from a listener at an acoustically "hard" surface to improve the energy-to-distance audio sound wave dispersion characteristics. For this reason, speakers are often placed on enclosures or stands that allow the directional aiming of speakers. Also, multimedia applications create a need in the industry for rapid configuration of speaker orientations without the use of tools or rewiring.

In U.S. Pat. No. 5,828,765 to Gable, a speaker assembly is disclosed for positioning a speaker within a recessed lighting fixture enclosure. Gable teaches that the speaker assembly is configured with a male threaded socket attached to and projecting from the speaker housing which is threadably adapted for insertion into a female socket within the recessed lighting enclosure. Although Gable allows some rotational movement of the speaker, such movement does not permit modification of the directional aim of the speaker (i.e. downward). The Gable configuration is further limited in that it achieves electrical and mechanical connection between the speaker and the enclosure for only a very limited range of rotational motion before such connections are significantly diminished or severed completely. Additionally, even though Gable discloses that a mechanical connection is achieved by threadably screwing the male socket to the female socket, it is further disclosed to use fastening screws to attach the speaker assembly to the interior of the enclosure.

Conventional speaker mounting systems allow for limited directional aiming of the speakers due to obstructions posed by electrical connections. Furthermore, in those systems, the electrical connections are independent of the mechanical connections, thereby making it is difficult to reposition the speakers because those systems are cumbersome to disassemble and reconfigure. Thus, there is a need in the industry for a speaker mounting system that allows a listener to easily aim a speaker in any direction without the inconvenience of using tools to reposition the speaker, and without the need to rewire or untangle wires and cables.

SUMMARY OF THE INVENTION

The present invention provides a system and method for providing concurrent mechanical and electrical connections to a speaker system while allowing a full range of rotational motion of a speaker with respect to an enclosure.

Briefly described, in architecture, the system comprises a mechanical mounting mechanism having an integrated electrical coupling mechanism. The mounting system comprises cylindrical intermating members that are configured to axially and concentrically couple with one another, thus allowing the speaker a full range of rotational motion about the cylindrical axis with respect to the enclosure while maintaining electrical contact. One set of cylindrical intermating members, comprising mechanical and electrical connectors, is associated with the speaker while another set of cylindrical intermating members, also comprising electrical and mechanical connectors, is associated with the enclosure. Thus, the system is designed so that the cylindrical intermating members of the speaker portion of the system concentrically and axially couple with the cylindrical intermating members of the enclosure portion of the system. Moreover, the electrical connectors are positioned within the mechanical connectors so as to allow for concurrent electrical coupling upon complete mechanical coupling between the speaker and the enclosure.

The present invention can also be viewed as providing a method for concurrently establishing a mechanical and an electrical connection between a speaker and an enclosure while allowing a full range of rotational motion of the speaker with respect to the enclosure. This method may be implemented by positioning a first rotatable electrical connector (i.e. a stereo jack) concentrically within a cylindrical intermating member associated with the speaker, placing a second rotatable electrical connector (i.e. a stereo plug) within a cylindrical intermating member associated with the enclosure, and securely connecting the cylindrical intermating member of the speaker to the cylindrical intermating member of the enclosure by axially and concentrically inserting one cylindrical intermating member into the other cylindrical intermating member.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1:
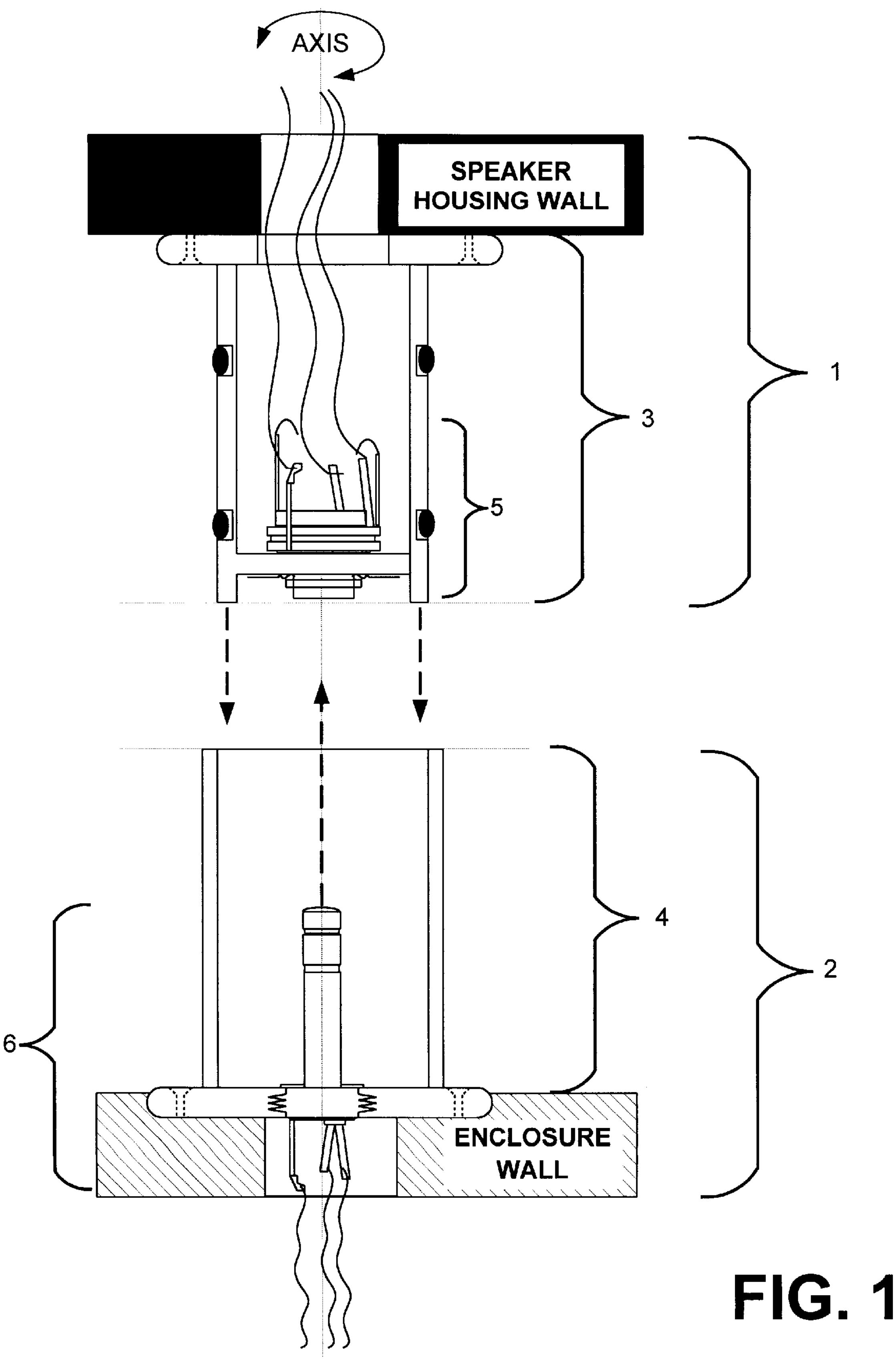
FIG. 1 is an exploded view of the speaker mounting system showing the mechanical and electrical connectors.

Having summarized the invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Turning now to the drawings, FIG. 1 is an exploded view of the speaker mounting system of the invention showing the speaker portion 1 of the speaker mounting system and the enclosure portion 2 of the speaker mounting system. The speaker portion 1 of the speaker mounting system comprises a mechanical speaker mount 3 and an electrical connector 5 associated with the speaker. The enclosure portion 2 of the speaker mounting system comprises a mechanical enclosure mount 4 and an electrical connector 6 associated with the enclosure to which the speaker is to be mounted. As seen from FIG. 1, the electrical connectors 5, 6 are integrated into the mechanical mounts 3, 4 which, when mated, comprise a single integrated unit.

Figure 2:
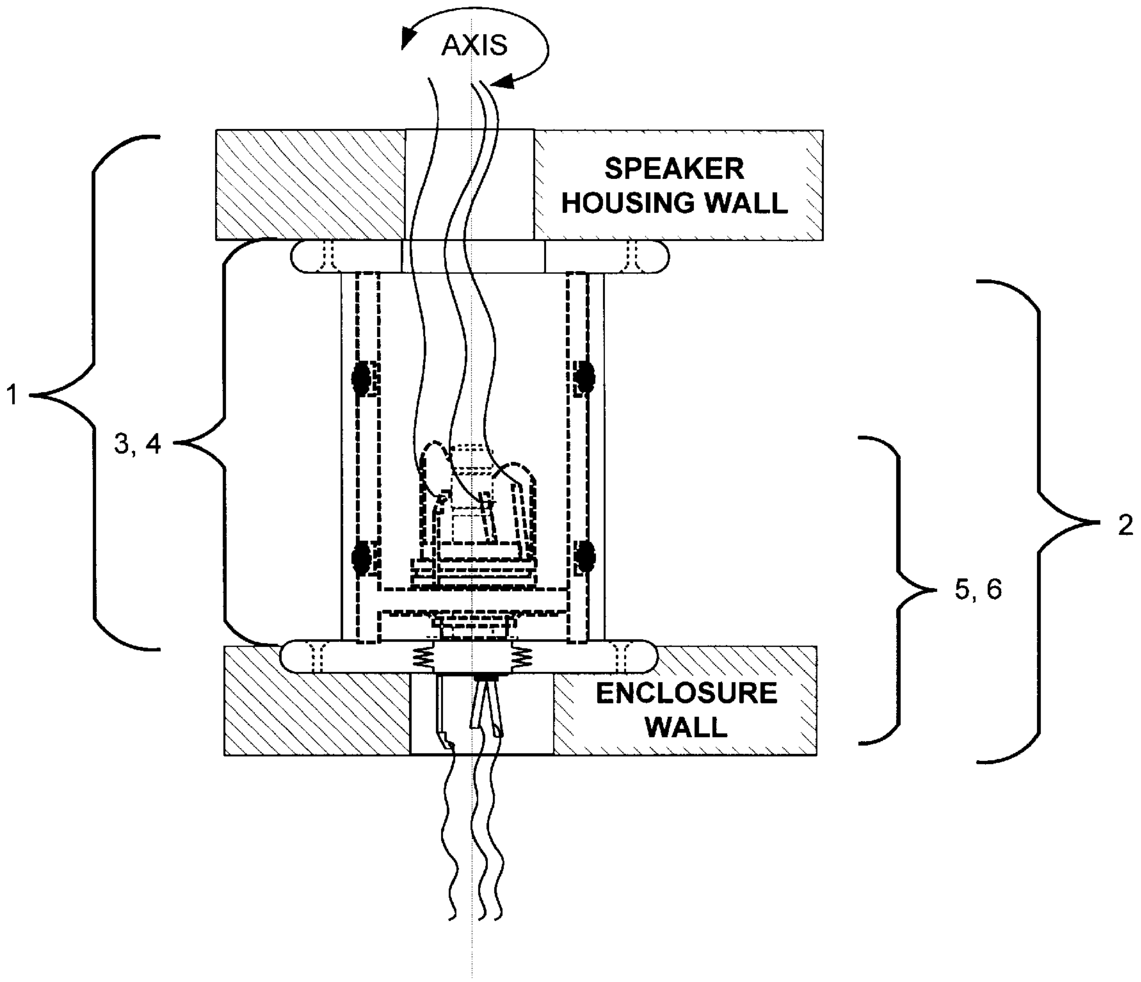
FIG. 2 is an assembly view of the speaker mounting system showing the coupling of the mechanical and electrical connectors.
Figure 5:
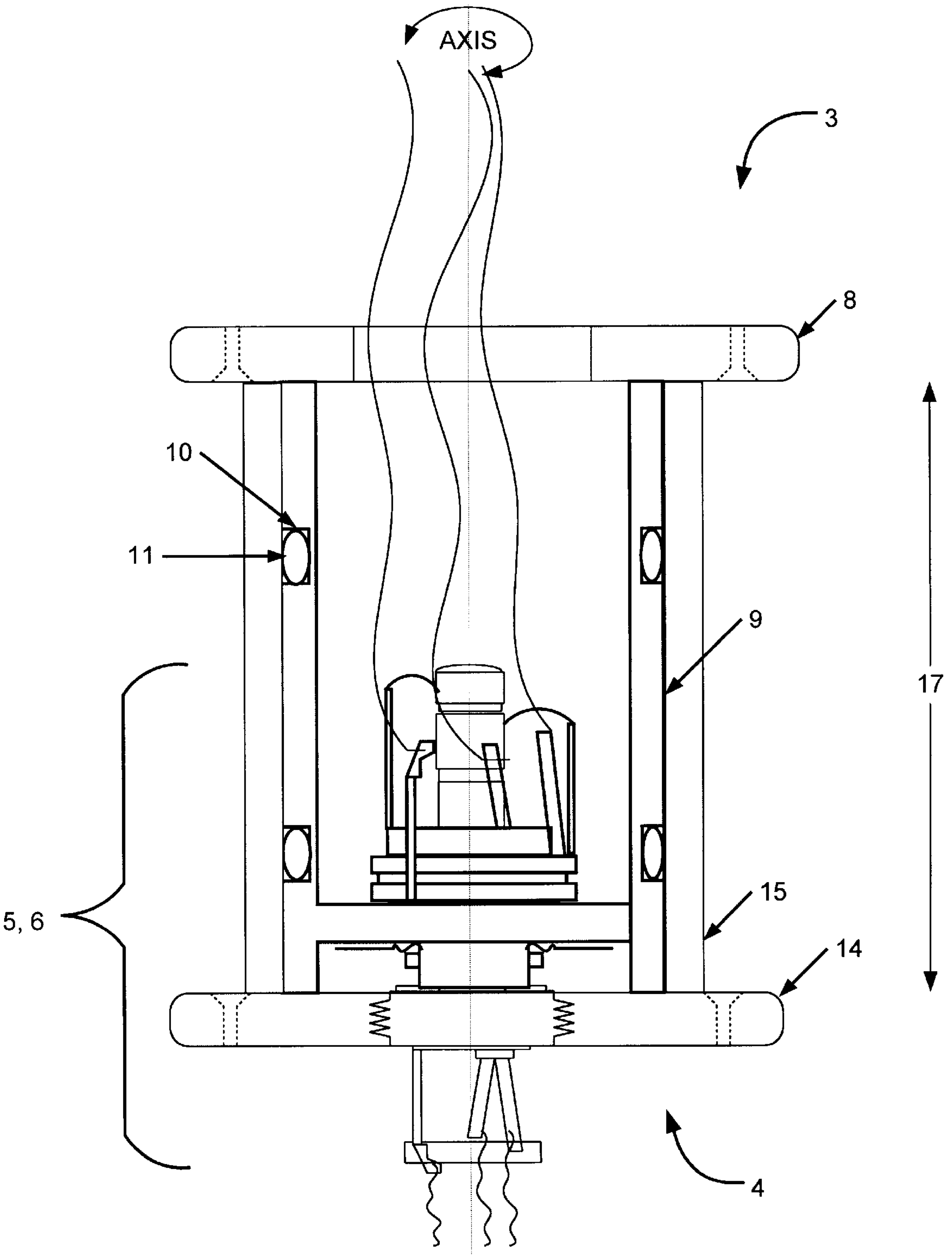
FIG. 5 illustrates the mechanical and electrical coupling of the speaker mount with the enclosure mount.
Figure 10:
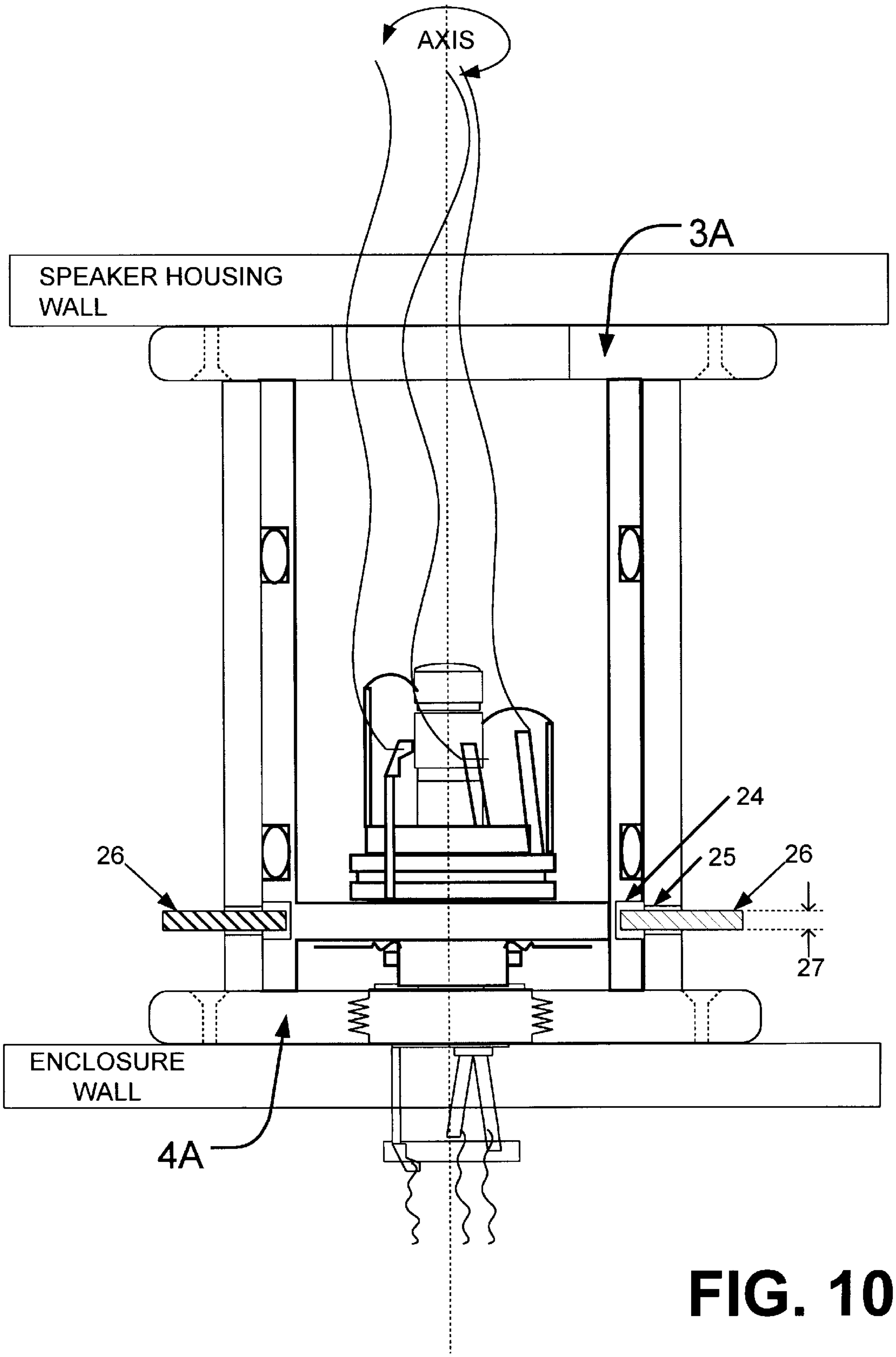
FIG. 10 illustrates an electrical connector having an additional channel for a locking mechanism.

FIG. 2 is an assembly view of the speaker mounting system with the speaker portion 1 coupled to the enclosure portion 2. As shown in the illustration, coupling of the speaker mount 3 and the enclosure mount 4 occurs concurrently with the coupling of the electrical connectors 5, 6 associated with the speaker mount 3 and the enclosure mount 4. Thus, the speaker mount 3 and the enclosure mount 4 are attachable and detachable with respect to one another, both mechanically and electrically, in a single-step operation. As shown in FIGS. 1, 5, and 10, the single-step attachment or detachment of the speaker mount with the enclosure mount is configured via a slide-on, slide-off operation, such that attachment or detachment can be performed without the use of tools and without reliance on threaded speaker-to-enclosure securing members. The current embodiment shown in FIGS. 3 and 5 comprises cylindrical mechanical mounts 3, 4, rotatable electrical connections 5, 6, and compressional/frictional securing O-rings 11. Thus, the axially concentric placement of the rotatable electrical connectors 5, 6 with respect to the speaker mount 3 and the enclosure mount 4 eliminates the obstructions, such as attachment wires, electrical terminal screws, and other mechanisms, typically present in conventional speaker mounting systems. This configuration also allows for continuous rotational motion having an unlimited range of full rotation, unlike prior art speaker mounting systems which only permit a very limited range of rotational motion. Furthermore, as shown in FIGS. 2, 5 and 10, the present invention achieves and maintains secure attachment of the speaker to the enclosure via compressional friction of the securing O-rings 11, thus not requiring securement of the speaker to the enclosure by rotational screwing of the speaker into a complementary threaded enclosure mount or by other securing means such as screws.

Figure 3:
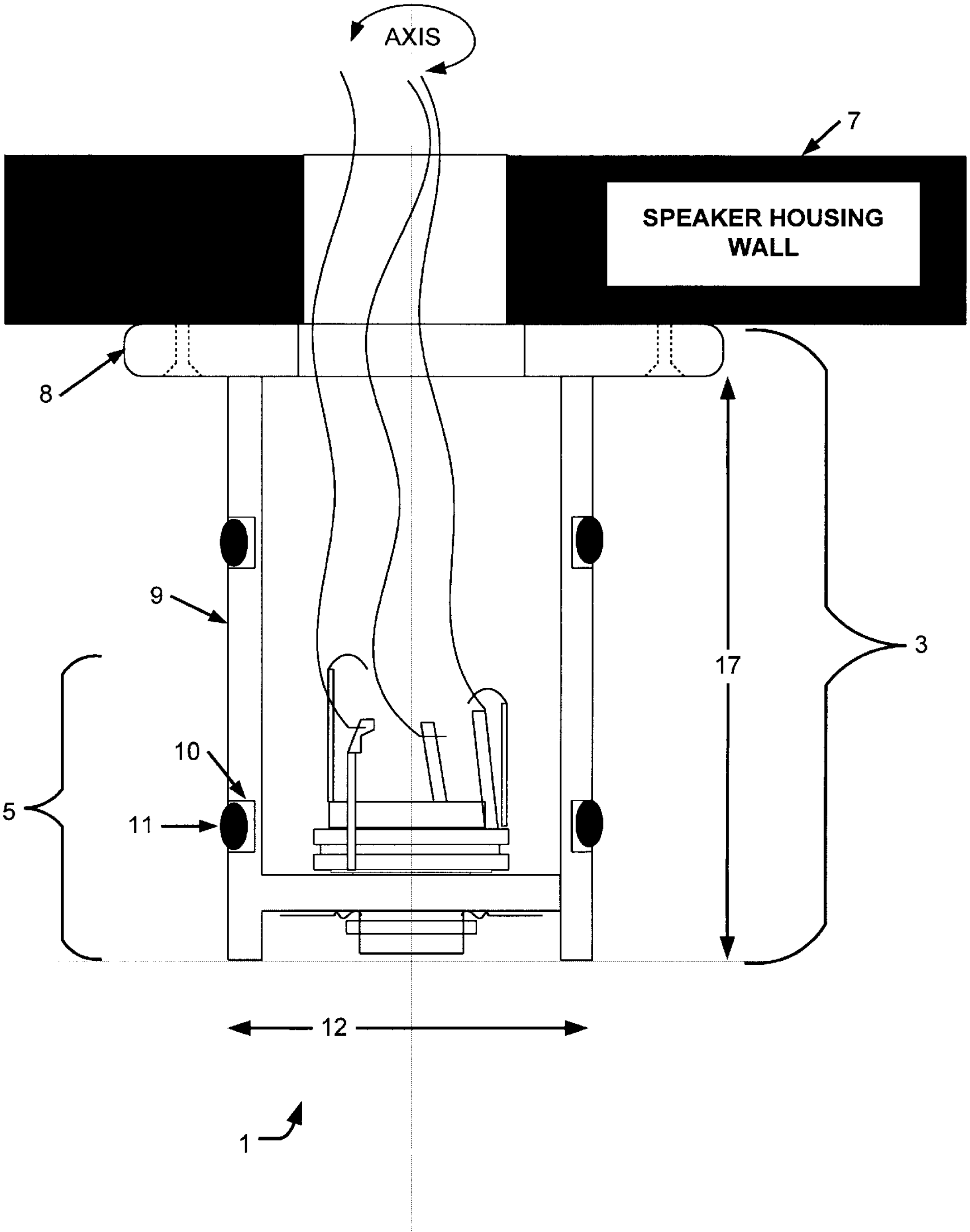
FIG. 3 illustrates the portion of the system associated with the speaker.
Figure 4:
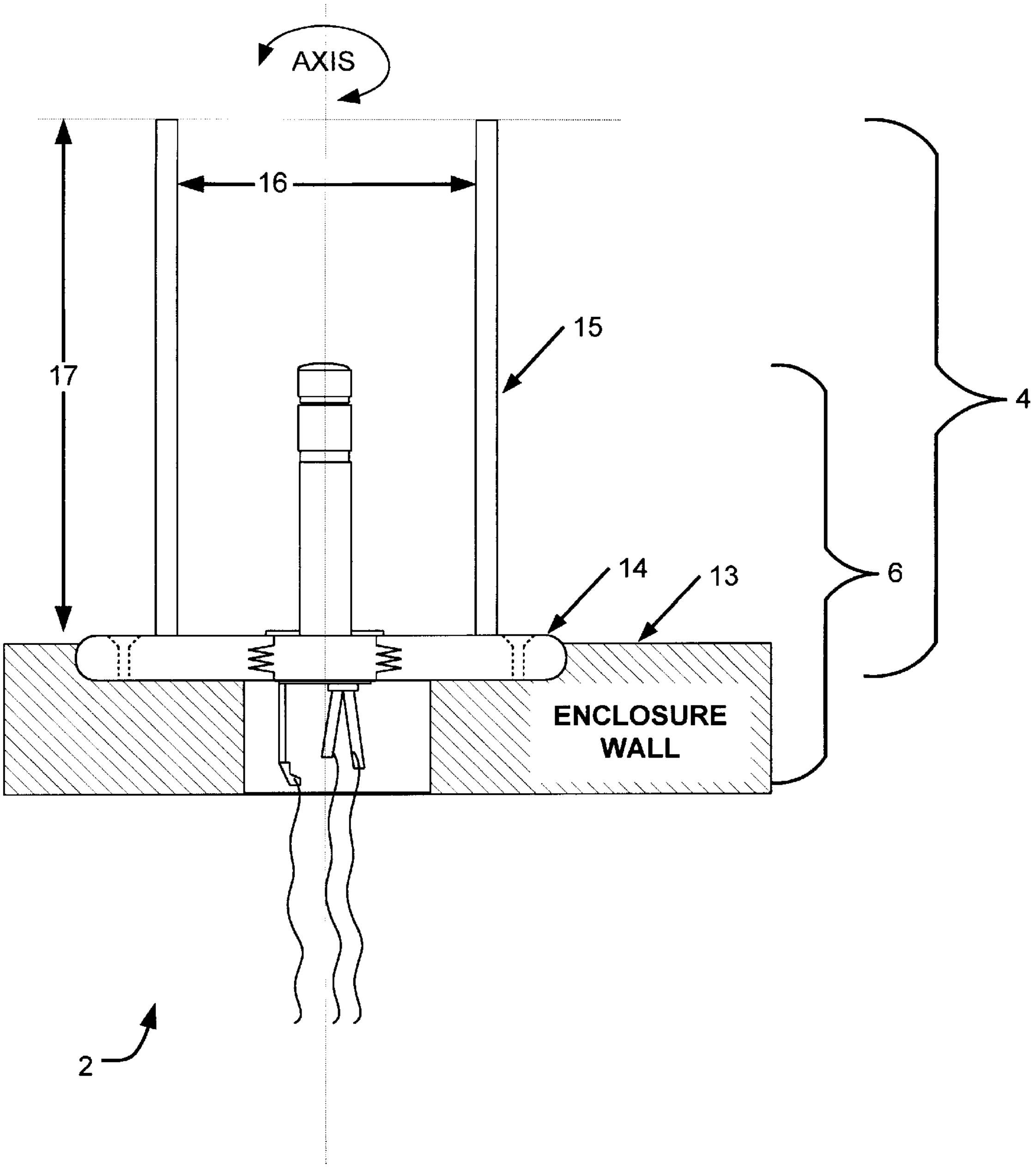
FIG. 4 illustrates the portion of the system associated with the enclosure.

FIG. 3 illustrates, in further detail, the speaker mount 3 of the speaker portion 1 of the speaker mounting system. The mechanical portion (FIG. 6) of the speaker mount 3 comprises a rigid cylindrical intermating member 9 having a fixed outer diameter 12 and a fixed cylindrical height 17 and a flange 8 at one end (the flanged end) of the rigid cylindrical intermating member 9. The flange 8 is configured to attach to a speaker-housing wall 7. A friction mechanism, an exemplar one of which is shown as comprising gasket(s) 11 circumferentially located in channel(s) 10 machined into the surface of the cylindrical intermating member 9, allows the speaker portion 1 to securely mate with the enclosure portion 2 (FIG. 4). The gasket(s) 11 provides a source of friction to prevent slippage of the cylindrical intermating member 9 when engaged with the cylindrical intermating member 15 of FIG. 4. The friction, as determined primarily by the compression, composition, and sliding friction of the gasket(s) relative to the inner surface of the cylindrical intermating member 15, is designed to be high enough to hold the intermated members together but low enough to allowing mating and unmating to be performed without tools by any intended user. The electrical connector 5 of the speaker mounting system is shown in FIG. 3 as a female electrical connector 5 located concentric to the speaker mount 3 at the opposite end (receptacle end) of the cylindrical intermating member 9 from the flanged end 8. The female electrical connector 5 is shown as a rotatable electrical connector with conducting spring and surface contacts (i.e. a connector that maintains electrical contact with a mating connector through a fall range of rotational motion relative to the mating connector), and specifically, as a female stereo jack. However, it will be obvious to one having ordinary skill in the art that the gender of the rotatable electrical connector 5 may be male, rather than female, and that the number of contacts can be more or fewer than shown in the illustration. FIG. 3 further illustrates coupling or connecting of conducting spring and surface contacts to fixed electrical contacts and coupling of fixed electrical contacts to conducting wires which can pass through opening in speaker housing wall 7 for electrical connection to (not shown) speaker(s), electrical "crossover networks", amplifier(s) such as may be found in "powered speakers", or other electronic systems.

FIG. 4 illustrates, in further detail, the enclosure mount 4 of the enclosure portion 2 of the speaker mounting system. The mechanical portion (FIG. 7) of the enclosure mount 4 comprises a rigid cylindrical intermating member 15, having a fixed cylindrical height 17 and a fixed inner diameter 16 that provides an interference fit with the outer diameter 12 of the rigid cylindrical intermating member 9 of FIG. 3. The mechanical portion includes a flange 14 at the flanged end of the cylindrical intermating member 15 configured to attach to an enclosure wall 13.

No friction mechanism is shown in the current embodiment of the enclosure mount 4 since the friction mechanism 10, 11 (FIG. 3) is located in the speaker mount 3 (FIG. 3). However, it will be obvious to one having ordinary skill in the art that additional grooves may be machined into the cylindrical intermating member 15 of the enclosure mount 4 to accommodate the gasket 11 (FIG. 3) shown in the speaker mount 3 (FIG. 3). The electrical connector 6 of the enclosure mounting system is shown in FIG. 4 as a male electrical connector 6 located concentric with the enclosure mount 4 at the receptacle end of the cylindrical intermating member 15. The male electrical connector 6 is also shown as a rotatable electrical connector, and specifically, as a male 3conductor stereo plug with conductive tip, ring, and sleeve mating surface contacts which contact and couple electrically to corresponding contacts in the mating female connector 5However, it will be obvious to one having ordinary skill in the art that the gender of the rotatable electrical connector 6 and the rotatable electrical connector 5 of FIG. 3 may be jointly reversed. FIG. 4 further illustrates coupling or connecting of tip, ring, and sleeve contacts to fixed electrical contacts and coupling of fixed electrical contacts to conducting wires which can pass through opening in enclosure wall 13 for electrical connection to amplifier, power supply, or other enclosure electronic systems (not shown).

FIG. 5 illustrates the speaker mounting system with the speaker mount 3 coupled to the enclosure mount 4. The coupling of the speaker mount 3 and the enclosure mount 4 occurs concurrently with the coupling of the rotatable electrical connectors 5, 6 associated with the speaker mount 3 and the enclosure mount 4. The mating of the speaker mount 3 to the enclosure mount 4 is done by fully inserting the cylindrical intermating member 9 of the speaker mount 3 into the cylindrical intermating member 15 of the enclosure mount 4. Since the speaker mount 3 has a fixed height 17 that is equal to the fixed height 17 of the enclosure mount 4, the coupling of the female connector 5 and the male connector 6 occurs concurrently with the mechanical mating of the speaker mount 3 with the enclosure mount 4. The axial mating of the rigid cylindrical intermating members 9, 15 compresses the gaskets 11 circumferentially located in the grooves 10 of the cylindrical intermating member 9 of the speaker mount 3, thus, providing friction between the speaker mount 3 and the enclosure mount 3 to maintain a secure mechanical connection. It is further shown in FIG. 5 that since the mechanical mounts 3, 4 and the electrical connectors 5, 6 are, when mated, integrated into a single unit, the mating or unmating of the mechanical mounts 3, 4 result in the concurrent connection or disconnection of the electrical connectors 5, 6 without the use of tools or rewiring. Also, the axial symmetry afforded by the cylindrical intermating members 9, 15 and the coaxial positioning of the rotatable electrical connectors 5, 6 allows full rotational motion between the speaker mount 3 with respect to the enclosure mount 4 without twisting of electrical wires. The full rotational motion permits the speaker mount to rotate an unlimited number of times in a given direction relative to the enclosure mount without diminishing or disconnecting the mechanical or electrical connections therebetween. When rotated, the enclosure and speaker wires remain fixed relative to their respective mounts 3, 4, which in turn are fixed relative to speaker housing 7 and enclosure 13 respectively.

The embodiment as shown in FIGS. 3, 4, and 5 illustrates the attachment of the speaker mount 3 to the speaker-housing wall 7, and the enclosure mount 4 to the enclosure wall 13, using screws positioned in the flange 14. However, the flanges 8, 14 are not necessary for the attachment of the speaker mount 3 and the enclosure mount 4 to the speaker-housing wall 7 and the enclosure wall 13, respectively. Moreover, while the mounts 3, 4 are attached to the walls 7, 13 using screws, it will be obvious to one having ordinary skill in the art that the mounts 3, 4 may be attached to the walls 7, 13 by epoxy, nails, or other adhesive or securing devices. Also, while the embodiment depicts a female electrical connector 5 associated with the speaker mount 3 and a male electrical connector 6 associated with the enclosure mount 4, the electrical connectors 5, 6 may be interchanged to associate the male electrical connector 6 with the speaker mount 3 and the female electrical connector 5 with the enclosure mount 4. Also, the inner diameter 16 of the enclosure mount 4 and the outer diameter 12 of the speaker mount 3 may be reversed so that the enclosure mount 4 inserts into the speaker mount 3, rather than the speaker mount 3 inserting into the enclosure mount 4, as depicted in FIGS. 3, 4, and 5. It will be obvious to one having ordinary skill in the art that the current invention may be implemented using different permutations of male and female electrical connectors, different permutations and numbers of electrical connections, different sizes and numbers of cylindrical intermating members, different numbers and types of gaskets for securing the intermating members, and other modifications.

Figure 6:
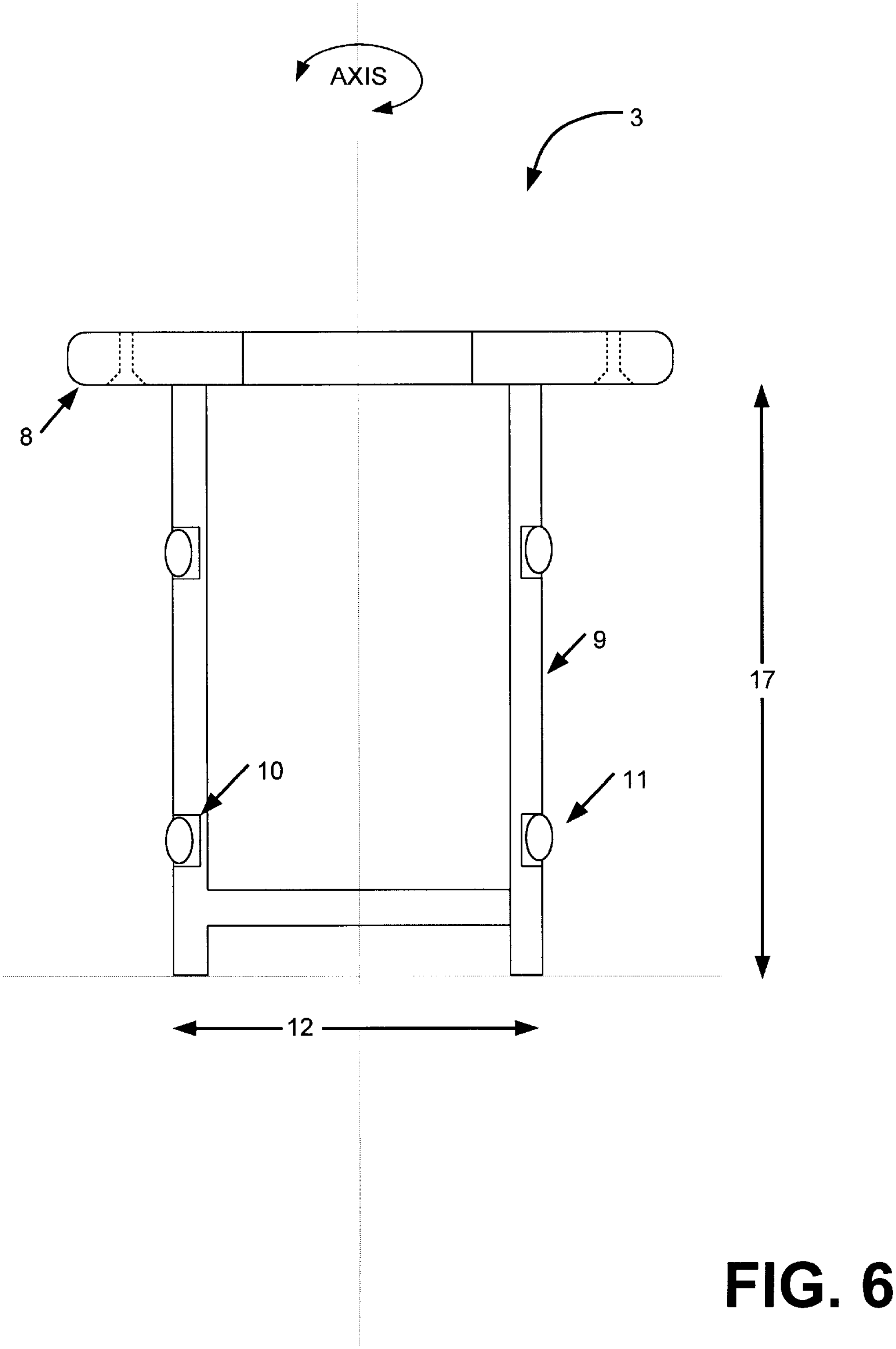
FIG. 6 illustrates a cylindrical intermating member associated with the speaker mount.
Figure 7:
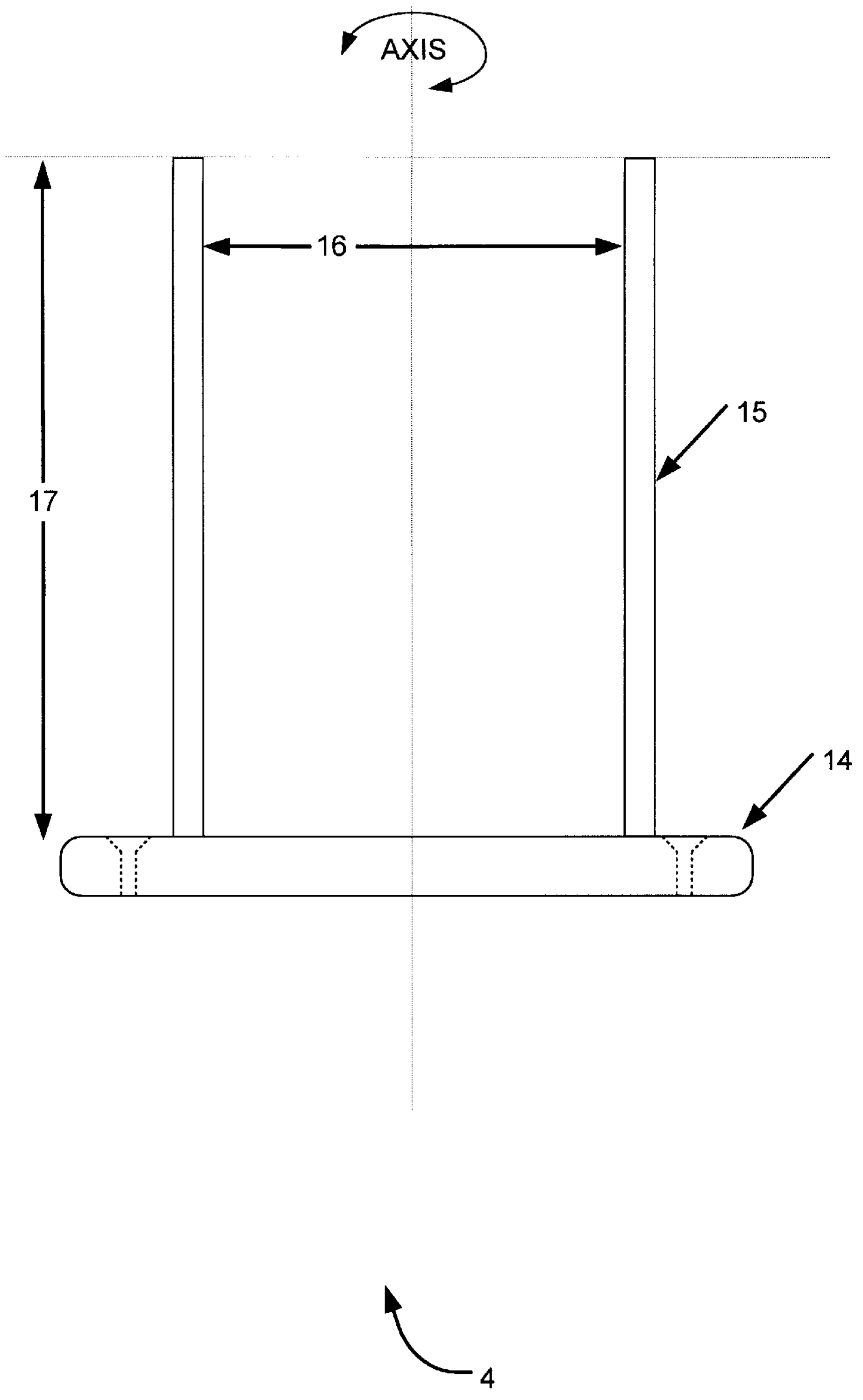
FIG. 7 illustrates a cylindrical intermating member associated with the enclosure mount.
Figure 8:
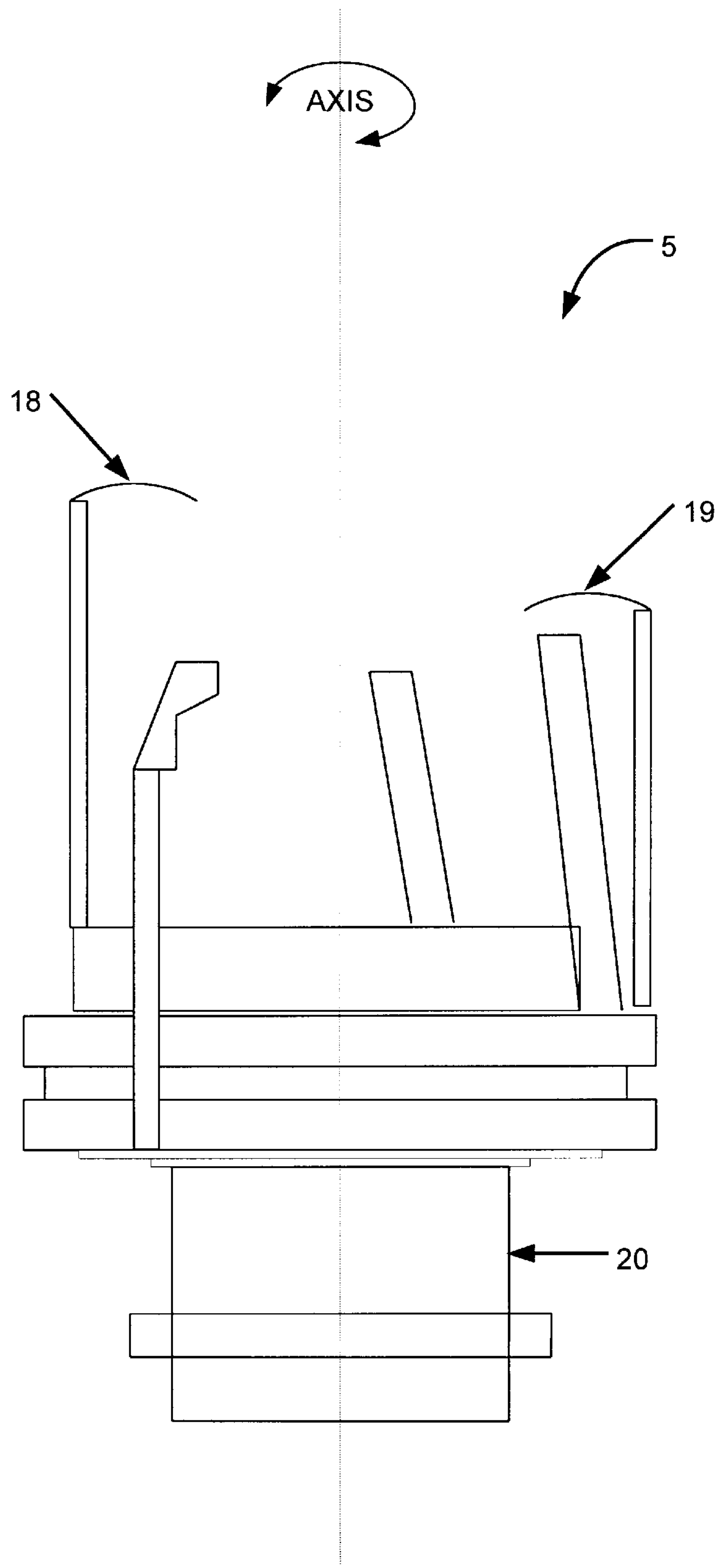
FIG. 8 illustrates an electrical connector associated with the speaker mount.
Figure 9:
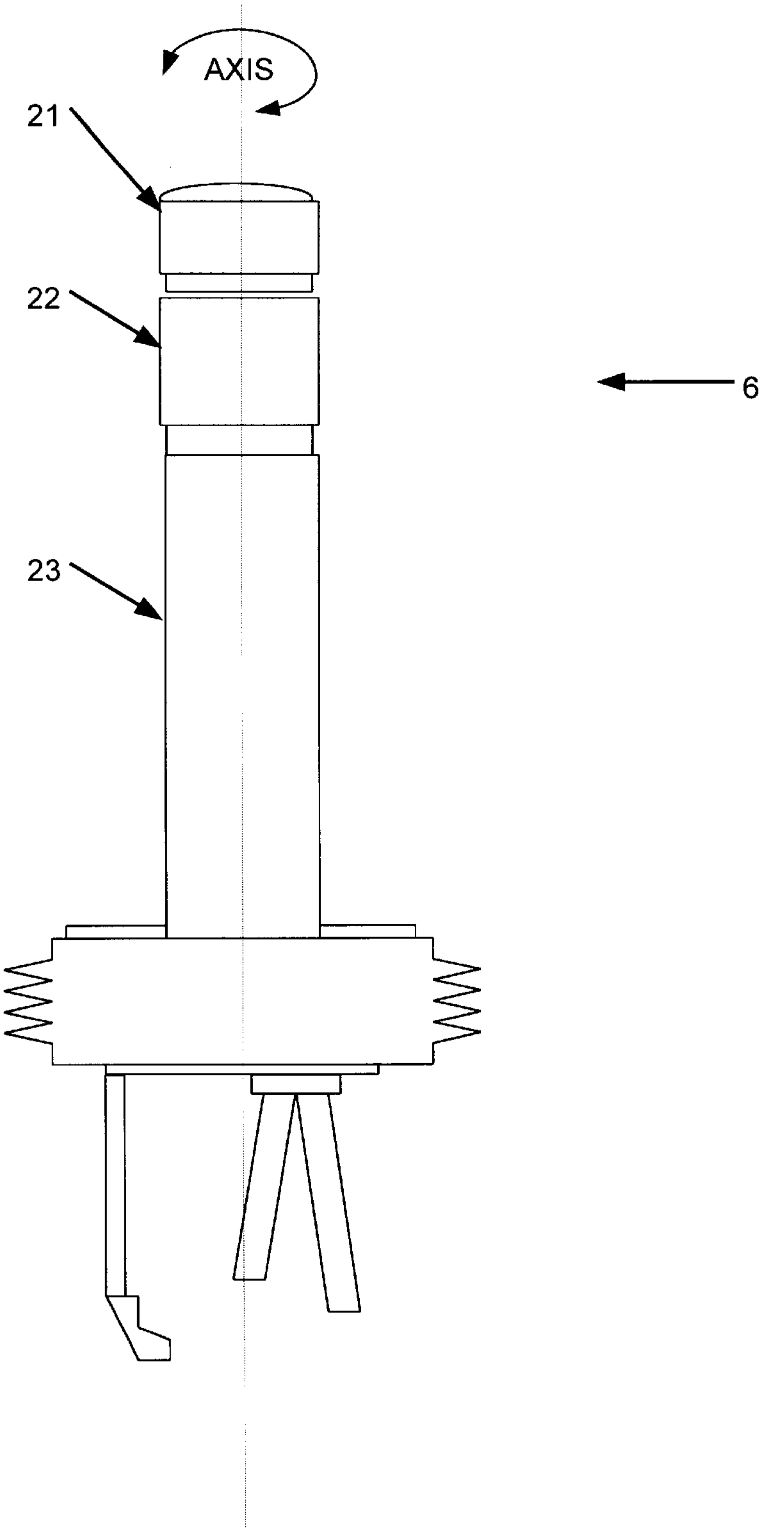
FIG. 9 illustrates an electrical connector associated with the enclosure mount.

For clarity, FIGS. 6 and 7 show the mechanical portions of the speaker mounting system isolated from the electrical portions of the speaker mounting system while FIGS. 8 and 9 show the electrical portions of the speaker mounting system isolated from the mechanical portions of the speaker mounting system.

FIG. 6 illustrates an embodiment of the mechanical portion speaker mount 3 isolated from the electrical portion 5 (not shown) of the speaker mount 3. The mechanical portion of the speaker mount 3 comprises a cylindrical intermating member 9 having a fixed outer diameter 12, a fixed height 17, and a flange 8 at the flanged end of the speaker mount 3, and a hole 8A for insertion and mounting of electrical connector. An example friction mechanism is shown in FIG. 6 as a gasket 11 circumferentially located in grooves 10 machined into the rigid cylindrical member 9 of the speaker mount 3.

FIG. 7 illustrates an embodiment of the mechanical portion of the enclosure mount 4 isolated from the electrical portion 6 (not shown) of the enclosure mount 4. The mechanical portion of the enclosure mount 4 comprises a cylindrical intermating member 15 having a fixed inner diameter 16, a fixed height 17, and a flange 14 at the flanged end of the enclosure mount 3, and a hole (shown as a threaded hole 14A) for insertion and mounting of electrical connector. The enclosure mount 4 is designed to mechanically mate with the speaker mount 3 (not shown). The inner diameter 16 of the cylindrical intermating member 15 of the enclosure mount 4 is slightly smaller than the outer diameter 12 (FIG. 6) of the cylindrical intermating member 9 (FIG. 6) of the speaker mount 3, thus, allowing for axial insertion of the speaker mount 3 (FIG. 6) into the enclosure mount 4. Since the height 17 of the cylindrical intermating members 9, 15 of the speaker mount 3 (FIG. 6) and the enclosure mount 4 are identical, complete mechanical coupling of the two mounts is established when the end of the cylindrical intermating member 15 of the enclosure mount 4 makes contact with the flange 8 of the speaker mount 3. Since many different types of rotatable mechanical connectors may be found in the prior art, and since a specific mechanical rotatable connector is not required, those devices will not be discussed further.

FIG. 8 shows a typical stereo jack that may be used as the female electrical connector 5 (FIG. 1). The figure shows a jack with a jack tip spring contact 18, a jack ring spring contact 19, and a jack sleeve surface contact 20 designed to make electrical contact with a plug as shown in FIG. 9. Although the embodiment shows a typical jack, it will be obvious to one having ordinary skill in the art that any rotatable electrical connector may be used in the implementation of the current invention.

FIG. 9 illustrates a typical stereo plug that may be used as the male electrical connector 6 (FIG. 1). The figure shows a plug tip 21, a plug ring 22, and a plug sleeve 23, designed to make electrical contact with the jack tip spring contact 18 (not shown), the jack ring spring contact 19 (not shown), and the jack sleeve surface contact 20 (not shown) of the plug shown in FIG. 8. Although the embodiment shows a typical stereo plug (FIG. 9), it will be obvious to one having ordinary skill in the art that any rotatable electrical connector may be used in the implementation of the current invention. Since many different types of rotatable electrical connectors may be found in the prior art, and since a specific rotatable connector is not required, those devices will not be discussed further.

Although the current invention shows a rotational speaker mounting system in which speakers may be removed from associated enclosure(s) without tools, through design of the friction between interlocking cylindrical members, there are applications which require rapid securing, without tools, of such rotational speakers to enclosure(s) or other surfaces, for deterrence of theft or misappropriation of speakers or for mechanical securing of speakers to enclosure(s) during transport or storage of enclosure(s). Such a modification to the system previously described in which speaker housing may, without tools, be secured (locked) to enclosure or unsecured (unlocked) while permitting full rotational motion of the speaker housing relative to the enclosure, is illustrated in FIG. 10 and FIG. 11.

FIG. 10 illustrates the speaker mounting system in which additional channel(s) 24 are formed or machined into the surface of the cylindrical intermating member 3A along with corresponding diametrically opposed slots 25 which are cut or formed in cylindrical intermating member 4A. The channel 24 and slot 25 are oriented such that they are aligned with each other when the two intermating members 3A, 4A are fully mated. A securing member 26 whose width 27 is less than the width of the slot 25 and channel 24, can be pressed into the channel 24 through the slot 25, thereby preventing the two intermating members 3A, 4A from being unmated or disengaged from each other.

Figure 11:
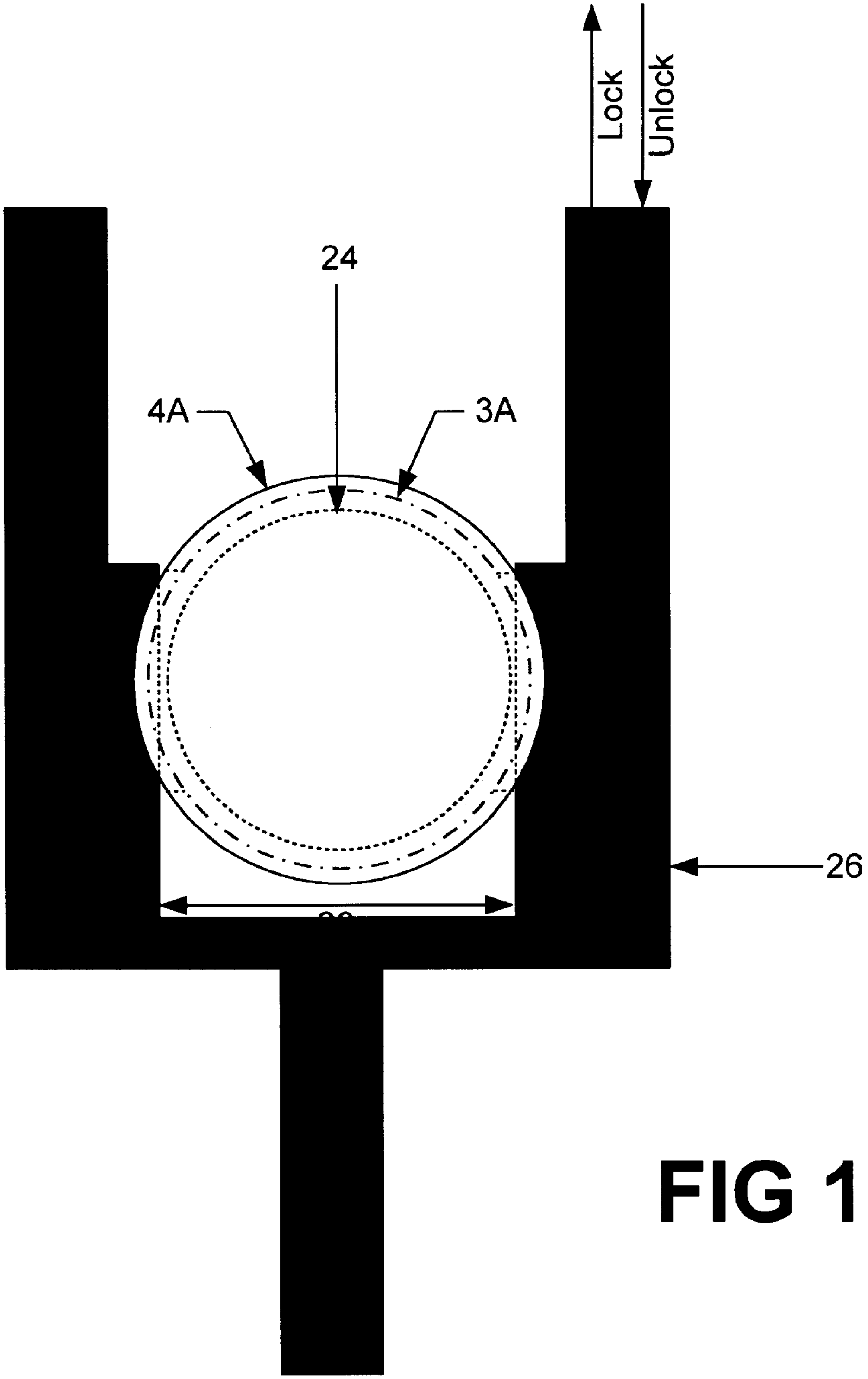
FIG. 11 illustrates a spring fork used for engaging the additional channel of FIG. 10 for locking the electrical connector in a mated position.
Figure 12:
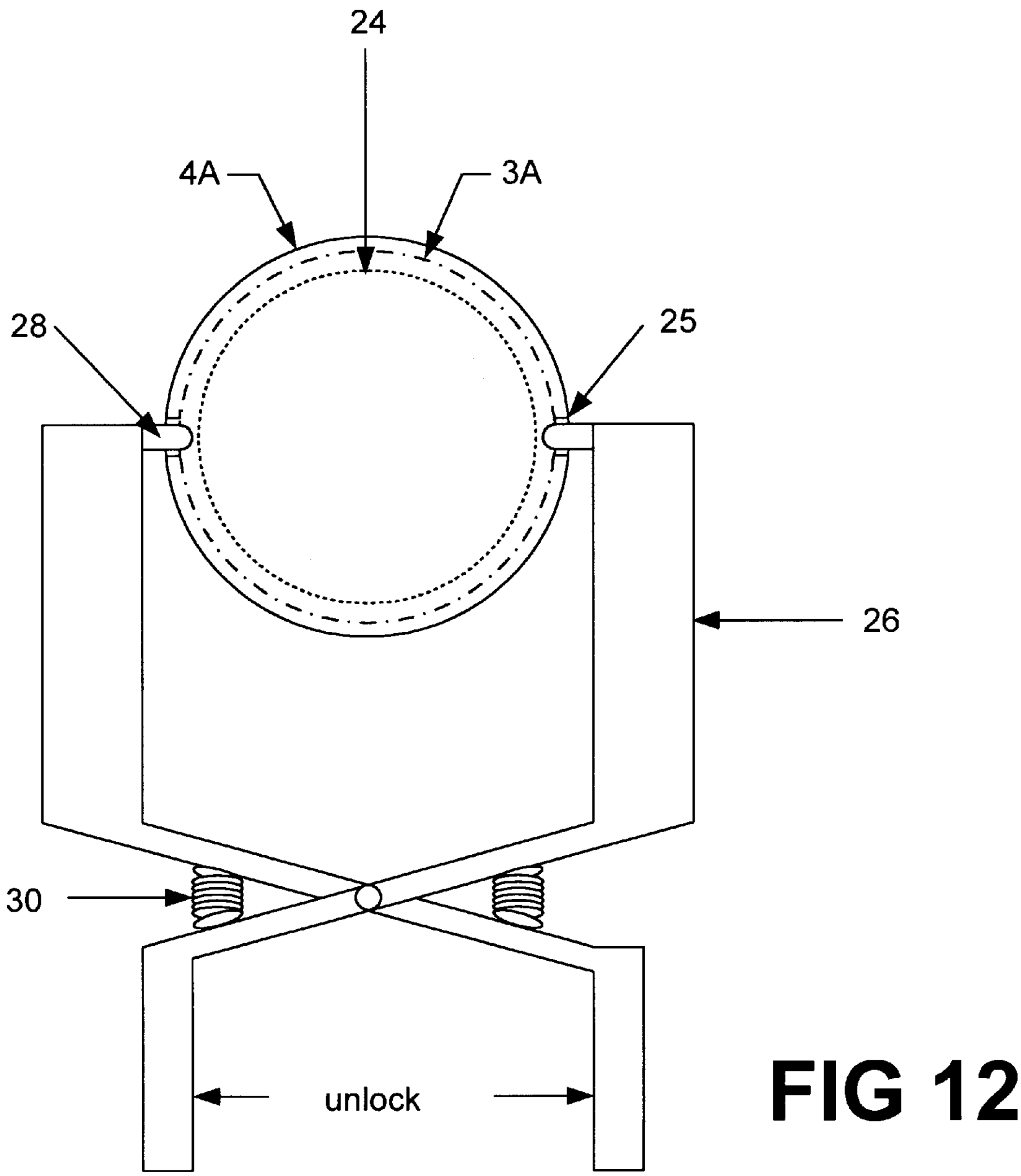
FIG. 12 illustrates a locking mechanism for the electrical connector in the form of a scissors apparatus.

Design of the securing member 26 is illustrated in FIG. 11 as a spring fork with variable width gap which may be slid through the slot 25 of the outer intermating member 4A, until its narrowest portion 29 is positioned through the slot, and into the channel(s) 24 of the inner intermating member 3A. It will be obvious to one having ordinary skill in the art that mechanisms other than the previously described preferred method for securing the intermating members may be devised; for example the channel(s) 24 in intermating member 3A may align with an intermating member 4A in which slot(s) 25 may be replaced by hole(s) and the securing member 26 by a corresponding securing member comprising plunger(s) 28 with cross section congruent with but slightly smaller than the hole(s) and with plungers diametrically opposed on a spring 30 assisted scissors securing member such as is illustrated in FIG. 12.

Although the current invention shows only one speaker mounting system, it will be obvious to one having ordinary skill in the art that the current invention may be modified to a "daisy-chain" speaker housing system, which accepts electrical input audio signals through one speaker mounting system and provides pass-through audio output signals for transmission to a second speaker mounting system.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A speaker mounting system providing concurrent mechanical and electrical connections, comprising:

a cylindrical speaker mount configured to attach to a speaker via a speaker-housing wall;

a cylindrical enclosure mount having a diameter slightly different than the diameter of the cylindrical speaker mount, the different diameter allowing for axial coupling of the cylindrical speaker mount and the cylindrical enclosure mount to provide a mechanical speaker mounting system, the cylindrical enclosure mount further configured to attach to an enclosure wall;

a first electrical connector located concentric to the speaker mount;

a second electrical connector located concentric to the enclosure mount, wherein an electrical connection is established through a male and female relationship between the first and second electrical connectors; and a coupling mechanism configured to securely couple the cylindrical speaker mount with the cylindrical enclosure mount, the coupling mechanism being configured to allow full rotation of the cylindrical speaker mount in relation to the cylindrical enclosure mount about a cylindrical axis of the cylindrical speaker mount and the cylindrical enclosure mount, while maintaining electrical continuity during the full rotation of the cylindrical speaker mount in relation to the cylindrical enclosure mount, wherein fUll rotation of the cylindrical speaker mount comprises an unlimited range of rotation of the speaker mount in at least one direction relative to the enclosure mount.

2. A speaker mounting system providing concurrent mechanical and electrical connections, comprising:

a mechanical mounting mechanism configured to establish a mechanical connection to mount a speaker; and an electrical coupling mechanism configured to establish an electrical connection to the speaker, the electrical coupling mechanism located concentric to the mechanical mounting mechanism, wherein the mechanical mounting mechanism and the electrical coupling mechanism are cylindrical intermating members, wherein said electrical and mechanical coupling is configured to permit full rotational motion of the speaker through an unlimited range of rotation in at least one direction without diminishing integrity of mechanical or electrical connections to the speaker.

3. The speaker system of claim 2, wherein the electrical connection is established concurrently with the mechanical connection.

4. The speaker mounting system of claim 2, wherein the mechanical mounting mechanism further comprises:

a speaker mount configured to mechanically mount the speaker, the speaker mount attached to a speaker-housing wall; and an enclosure mount configured to mechanically mount the speaker, the enclosure mount having a diameter slightly different from the diameter of the speaker mount allowing axial coupling of the speaker mount and the enclosure mount, the enclosure mount further attached to an enclosure wall.

5. The speaker mounting system of claim 4, the electrical coupling mechanism further comprising:

a first connector concentrically carried on the speaker mount and a second connector concentric carried on the enclosure mount, wherein the first and second connectors are either male or female.

6. The speaker mounting system of claim 2, wherein the mechanical mounting mechanism and the electrical coupling mechanism are configured to allow full rotational motion about the cylindrical axis.

7. The speaker mounting system of claim 6, further comprising a coupling mechanism configured to securely connect the speaker mount to the enclosure mount.

8. The speaker mounting system of claim 2, further comprising a speaker attached to the mechanical mounting mechanism.

9. The speaker mounting system of claim 2, further comprising stereo equipment attached to the mechanical mounting mechanism.

10. A speaker mounting system providing concurrent mechanical and electrical connections, comprising:

a mechanical means for mechanically mounting a speaker to an enclosure; and an electrical means for electrically coupling the speaker to a power source, the electrical means located concentric to the mechanical means, wherein the mechanical means and the electrical means allow for full rotational motion of the speaker about the cylindrical axis of the mechanical means and the electrical means, wherein full rotational motion of the speaker comprises an unlimited range of rotation of the speaker in at least one direction relative to the axis of the mechanical means and the electrical means without diminishing integrity of mechanical or electrical connections between the speaker and said mechanical means and electrical means.

11. The speaker mounting system of claim 10, wherein the mechanical coupling occurs concurrently with the electrical coupling.

12. The speaker mounting system of claim 10, further including locking means for locking the mechanical coupling from becoming disengaged, while preserving the ability of the mechanical coupling to have rotation motion.

13. A speaker mounting system providing concurrent mechanical and electrical connections, comprising:

a speaker mount configured to attach to a speaker;

an enclosure mount configured to attach to an enclosure, the enclosure mount further configured to concentrically couple with the speaker mount so as to allow full rotational motion of the speaker mount with respect to the enclosure mount, wherein full rotational motion of the speaker mount comprises an unlimited range of rotation of the speaker mount in at least one direction relative to the enclosure mount without diminishing integrity of mechanical and electrical connections between the speaker mount and the enclosure mount;

a first electrical connector located concentric to the speaker mount; and a second electrical connector located concentric to the enclosure mount, configured to allow full rotational motion of the speaker mount with respect to the enclosure mount, wherein the first and second electrical connectors are either male or female, wherein a coupling of the first electrical connector and the second electrical connector occurs concurrently with the coupling of the speaker mount and the enclosure mount through a male/female relationship, and wherein electrical continuity is maintained during the full rotational motion of the speaker mount with respect to the enclosure mount.

14. The speaker mounting system of claim 13, further comprising a securing mechanism configured to securely connect the speaker mount to the enclosure mount.

15. The speaker mounting system of claim 13, wherein the speaker mount and the enclosure mount are cylindrical.

16. The speaker mounting system of claim 13, further configured to allow full rotational motion of the speaker mount with respect to the enclosure mount about a cylindrical axis of the speaker mount and the enclosure mount.

17. A method for mounting a speaker to establish concurrent electrical and mechanical connections between a speaker and an enclosure while allowing full rotational motion of the speaker, wherein full rotational motion of the speaker comprises an unlimited range of rotation of the speaker in at least one direction relative to the enclosure without diminishing integrity of mechanical and electrical connections between the speaker and the enclosure; comprising the steps of:

positioning a first electrical connector concentrically within a cylindrical speaker mount;

positioning a second electrical connector concentrically within a cylindrical enclosure mount having a diameter slightly different from the diameter of the cylindrical speaker mount;

securely connecting the cylindrical speaker mount to the cylindrical enclosure mount by axially inserting the cylindrical speaker mount into the cylindrical enclosure mount; and establishing an electrical connection between the first electrical connector and the second electrical connector concurrently with the step of securely connecting the cylindrical speaker mount to the cylindrical enclosure such that the electrical and mechanical connections are maintained during an unlimited range of rotation of the cylindrical speaker mount in at least one direction relative to the cylindrical enclosure mount.

* * * * *